United States Patent

Willems et al.

[11] Patent Number: 5,864,308
[45] Date of Patent: Jan. 26, 1999

[54] SYSTEM, CODING SECTION, ARRANGEMENT, CODING APPARATUS, AND METHOD

[75] Inventors: Franciscus Maria Joannes Willems; Tjalling Jan Tjalkens, both of Geldrop, Netherlands

[73] Assignee: Koninklijke Ptt Nederland N.V., Netherlands

[21] Appl. No.: 884,987

[22] Filed: Jun. 30, 1997

[30] Foreign Application Priority Data

Jul. 15, 1996 [EP] European Pat. Off. ............... 96202007

[51] Int. Cl.$^6$ ..................................................... H03M 7/00
[52] U.S. Cl. ................................................................. 341/51
[58] Field of Search ................................. 341/51, 107, 87, 341/63, 95, 106

[56] References Cited

U.S. PATENT DOCUMENTS

| | | |
|---|---|---|
| 4,286,256 | 8/1981 | Langdon, Jr. et al. . |
| 4,494,108 | 1/1985 | Langdon, Jr. et al. . |
| 5,023,611 | 6/1991 | Chamzas et al. . |
| 5,025,258 | 6/1991 | Duttweiler . |
| 5,210,536 | 5/1993 | Furlan . |
| 5,298,896 | 3/1994 | Lei et al. . |
| 5,357,250 | 10/1994 | Healey et al. . |

FOREIGN PATENT DOCUMENTS

| | | |
|---|---|---|
| 0 410 060 | 1/1991 | European Pat. Off. . |
| 0 480 115 | 4/1992 | European Pat. Off. . |

OTHER PUBLICATIONS

F.M.J. Willems et al, "The Context–Tree Weighting Method: Basic Properties", IEEE Transactions on Information Theory, vol. 41, No. 3, May 1995, pp. 653–664.

Primary Examiner—Brian K. Young
Attorney, Agent, or Firm—Michaelson & Wallace; Peter L. Michaelson

[57] ABSTRACT

Known systems use two probability signals for coding an input signal into an output signal and for decoding said output signal into the input signal. In a first memory field two probability signals are stored, and in a second memory field two other probability signals are stored, and in response to a further received symbol processor means adapt the probability signals. Such a system needs a giant memory capacity, which can be reduced by combining probability signals into a first combination signal to be stored in the first memory field and by combining further probability signals into a second combination signal to be stored in the second memory field, and by converting a third combination signal into at least one probability signal just before (de)coding takes place.

8 Claims, 2 Drawing Sheets

| 21 | $B_1$ | $a_1$ | $b_1$ |
| --- | --- | --- | --- |
| 22 | $B_2$ | $a_2$ | $b_2$ |
| 23 | $B_3$ | $a_3$ | $b_3$ |
| 24 | $B_4$ | $a_4$ | $b_4$ |
| 25 | $B_5$ | $a_5$ | $b_5$ |
| 26 | $B_6$ | $a_6$ | $b_6$ |
| 27 | $B_7$ | $a_7$ | $b_7$ |
| 28 | $B_8$ | $a_8$ | $b_8$ |

20

SYSTEM, CODING SECTION, ARRANGEMENT, CODING APPARATUS, AND METHOD

BACKGROUND OF THE INVENTION

The invention relates to a system comprising a first coding section for coding a first digital signal into a second digital signal and comprising a second coding section for decoding the second digital signal into a third digital signal, the first coding section and the second coding section being coupled via a transmission channel, the first coding section comprising a first arrangement being provided with
an input for receiving the first digital signal comprising a number of symbols,
an output for generating a fourth digital signal comprising at least one probability signal,
a first coding apparatus being provided with
a first input for receiving the first digital signal comprising said number of symbols,
a second input for receiving the fourth digital signal originating from the first arrangement, and
an output for generating the second digital signal, and the second coding section comprising
a second arrangement being provided with
an input for receiving the third digital signal comprising a number of symbols and originating from a second coding apparatus,
an output for generating a fifth digital signal comprising at least one probability signal,
the second coding apparatus being provided with
a first input for receiving the second digital signal originating from the first coding apparatus,
a second input for receiving the fifth digital signal originating from the second arrangement, and
an output for generating the third digital signal comprising said number of symbols,
the first coding section and the second coding section each being provided with
memory means comprising at least a first memory field and a second memory field for storing in the first memory field at least
first information relating to at least two probability signals, and
second information relating to at least a first number of symbols having a first value and a second number of symbols having a second value, and for storing in the second memory field at least
third information relating to at least two probability signals, and
fourth information relating to at least a third number of symbols having a first value and a fourth number of symbols having a second value, and
processor means coupled to the memory means for adapting the information in response to a further received symbol.

Such a system is known from U.S. Pat. No. 5,023,611, which discloses the first coding section (encoder 101 in FIG. 1 of U.S. Pat. No. 5,023,611) comprising the first arrangement (context extractor 105 and probability estimator 106 in FIG. 1 of U.S. Pat. No. 5,023,611) and the first coding apparatus (entropy encoder unit 104 in FIG. 1 of U.S. Pat. No. 5,023,611), and which discloses the second coding section (decoder 103 in FIG. 1 of U.S. Pat. No. 5,023,611) comprising the second arrangement (context extractor 110 and probability estimator 111 in FIG. 1 of U.S. Pat. No. 5,023,611) and the second coding apparatus (entropy decoder unit 109 in FIG. 1 of U.S. Pat. No. 5,023,611). Both coding sections are coupled via a transmission channel (transmission media 102 in FIG. 1 of U.S. Pat. No. 5,023,611), and each comprise processor means (context extractor 105 comprises a computer or a digital signal processor as disclosed in column 3 lines 21–26 of U.S. Pat. No. 5,023,611, and context extractor 110 is identical to context extractor 105 as disclosed in column 7 lines 61–66 of U.S. Pat. No. 5,023,611). Such processor means will always be coupled to memory means which, as disclosed in IEEE Transactions on INFORMATION THEORY, May 1995, Volume 41, Number 3, in particular "The Context-Tree Weighting Method: Basic Properties", by F. M. J. Willems, Y. M. Shtarkov and T. J. Tjalkens, pages 653–664, will comprise at least a first memory field and a second memory field for storing in the first memory field at least first information relating to at least two probability signals ($P_e(a_s,b_s)$ and $P_w^s$ as disclosed on page 659 of the IEEE article) and second information relating to at least a first number of symbols having a first value and a second number of symbols having a second value and for storing in the second memory field at least third information relating to at least two probability signals and fourth information relating to at least a third number of symbols having a first value and a fourth number of symbols having a second value. In response to a further received symbol, the processor means adapt said information.

Such a system is disadvantageous because it needs a giant memory capacity inside the first arrangement as well as inside the second arrangement.

SUMMARY OF THE INVENTION

It is an object of the invention, inter alia, to provide a system as described in the preamble which needs less memory capacity.

The system according to the invention is characterised in that the first coding section and the second coding section are each provided with
combining means for combining at least two probability signals into a first combination signal, the first information being a function of this first combination signal, and for combining at least two probability signals into a second combination signal, the third information being a function of this second combination signal, and for combining at least two probability signals into a third combination signal, and
converting means for converting the third combination signal into at least one probability signal.

By providing the first arrangement as well as the second arrangement with combining means for combining at least two probability signals (by for example subtracting) into a first combination signal, the first information being a function of this first combination signal, and for combining at least two probability signals (by for example subtracting) into a second combination signal, the third information being a function of this second combination signal, and for combining at least two probability signals into a third combination signal, and by providing the first coding section as well as the second coding section with converting means for converting the third combination signal into at least one probability signal, the system according to the invention needs less memory capacity.

The invention is based, inter alia, on the insight that inside each arrangement it is sufficient to store only one combination signal instead of two probability signals, and that inside each coding apparatus (or possibly each arrangement) said third combination signal can be converted into one or more probability signals by using knowledge which is already present inside each coding apparatus (or possibly each arrangement).

The problem of known systems needing giant memory capacity is solved by storing only one combination signal instead of two probability signals, which reduces the needed memory capacity. A further reduction can be realised by establishing logarithmic representations of probability signals and using these logarithmic representations for the calculations, and by lopping off probability signals and/or logarithmic representations of these probability signals.

A first embodiment of the system according to the invention is characterised in that the first combination signal comprises a ratio of probability signals, and that the second combination signal comprises a ratio of probability signals.

By generating the first combination signal being a ratio of probability signals, and generating the second combination signal being a ratio of probability signals, on the one hand combination signals are created which possess the value one substantially (apart from other factors) in case both probability signals possess the same value substantially, and on the other hand combination signals are created which possess a value which is much greater or smaller than one (apart from other factors) in case both probability values differ a lot. Because of using ratios, firstly the lopping off becomes an interesting technique (all ratios<0.01 could be defined as being equal to 0.01, and all ratios>100 could be defined as being equal to 100), and secondly the use of logarithmic representations becomes another interesting technique, due to the fact that multiplying becomes adding and dividing becomes subtracting.

The invention further relates to a coding section for coding a first digital signal into a second digital signal, the first coding section comprising a first arrangement being provided with
an input for receiving the first digital signal comprising a number of symbols,
an output for generating a fourth digital signal comprising at least one probability signal,
a first coding apparatus being provided with
a first input for receiving the first digital signal comprising said number of symbols,
a second input for receiving the fourth digital signal originating from the first arrangement, and
an output for generating the second digital signal, the coding section being provided with
memory means comprising at least a first memory field and a second memory field for storing in the first memory field at least
first information relating to at least two probability signals, and
second information relating to at least a first number of symbols having a first value and a second number of symbols having a second value, and for storing in the second memory field at least
third information relating to at least two probability signals, and
fourth information relating to at least a third number of symbols having a first value and a fourth number of symbols having a second value, and
processor means coupled to the memory means for adapting the information in response to a further received symbol.

The coding section according to the invention is characterised in that the coding section is provided with combining means for combining at least two probability signals into a first combination signal, the first information being a function of this first combination signal, and for combining at least two probability signals into a second combination signal, the third information being a function of this second combination signal, and for combining at least two probability signals into a third combination signal, and
converting means for converting the third combination signal into at least one probability signal.

A first embodiment of the coding section according to the invention is characterised in that the first combination signal comprises a ratio of probability signals, and that the second combination signal comprises a ratio of probability signals.

The invention further relates to an arrangement comprising
an input for receiving a first digital signal comprising a number of symbols,
an output for generating a fourth digital signal comprising at least one probability signal,
memory means comprising at least a first memory field and a second memory field for storing in the first memory field at least
first information relating to at least two probability signals, and
second information relating to at least a first number of symbols having a first value and a second number of symbols having a second value, and for storing in the second memory field at least
third information relating to at least two probability signals, and
fourth information relating to at least a third number of symbols having a first value and a fourth number of symbols having a second value, and
processor means coupled to the memory means for adapting the information in response to a further received symbol.

The arrangement according to the invention is characterised in that the arrangement is provided with
combining means for combining at least two probability signals into a first combination signal, the first information being a function of this first combination signal, and for combining at least two probability signals into a second combination signal, the third information being a function of this second combination signal.

A first embodiment of the arrangement according to the invention is characterised in that the first combination signal comprises a ratio of probability signals, and that the second combination signal comprises a ratio of probability signals.

The invention further relates to a coding apparatus comprising
a first input for receiving a first digital signal comprising a number of symbols,
a second input for receiving a fourth digital signal comprising at least one probability signal and originating from an arrangement, and
an output for generating a second digital signal.

The coding apparatus according to the invention is characterised in that the fourth digital signal comprises a third combination signal being a combination of at least two probability signals, the coding apparatus being provided with
converting means for converting the third combination signal into at least one probability signal.

A first embodiment of the coding apparatus according to the invention is characterised in that the third combination signal comprises a ratio of probability signals.

The invention further relates to a method for coding a first digital signal into a second digital signal and for decoding the second digital signal into a third digital signal, the method comprising the steps of receiving the first digital signal comprising a number of symbols, generating, in response to the first digital signal, a fourth digital signal comprising at least one probability signal, coding the first digital signal into the second digital signal by using the fourth digital signal, generating, in response to the third digital signal, a fifth digital signal comprising at least one probability signal, decoding the second digital signal into the third digital signal by using the fifth digital signal, storing in a first memory field at least first information relating to at least two probability signals, and second information relating to at least a first number of symbols having a first value and a second number of symbols having a second value, storing in a second memory field at least third information relating to at least two probability signals, and fourth information relating to at least a third number of symbols having a first value and a fourth number of symbols having a second value, and adapting the information in response to a further received symbol.

Such a method is known from a combination of U.S. Pat. No. 5,023,611 and IEEE Transactions on INFORMATION THEORY, May 1995, Volume 41, Number 3, in particular "The Context-Tree Weighting Method: Basic Properties", by F. M. J. Willems, Y. M. Shtarkov and T. J. Tjalkens, pages 653–664.

Such a method is disadvantageous because it needs a giant memory capacity.

It is a further object of the invention, inter alia, to provide a method as described before which needs less memory capacity.

The method according to the invention is characterised in that the method comprises the steps of combining at least two probability signals into a first combination signal, the first information being a function of this first combination signal, combining at least two probability signals into a second combination signal, the third information being a function of this second combination signal, combining at least two probability signals into a third combination signal, and converting the third combination signal into at least one probability signal.

A first embodiment of the method according to the invention is characterised in that the first combination signal comprises a ratio of probability signals, and that the second combination signal comprises a ratio of probability signals.

REFERENCES

U.S. Pat. No. 5,023,611.
IEEE Transactions on INFORMATION THEORY, May 1995, Volume 41, Number 3, in particular "The Context-Tree Weighting Method: Basic Properties", by F. M. J. Willems, Y. M. Shtarkov and T. J. Tjalkens, pages 653–664.
U.S. Pat. No. 5,025,258.
U.S. Pat. No. 4,286,256.
U.S. Pat. No. 4,494,108.
U.S. Pat. No. 5,357,250.

All references including the references cited in these references are considered to be incorporated in this patent application.

EMBODIMENT

The invention will be explained at the hand of an embodiment shown in the figures.

Figures 1, 2:
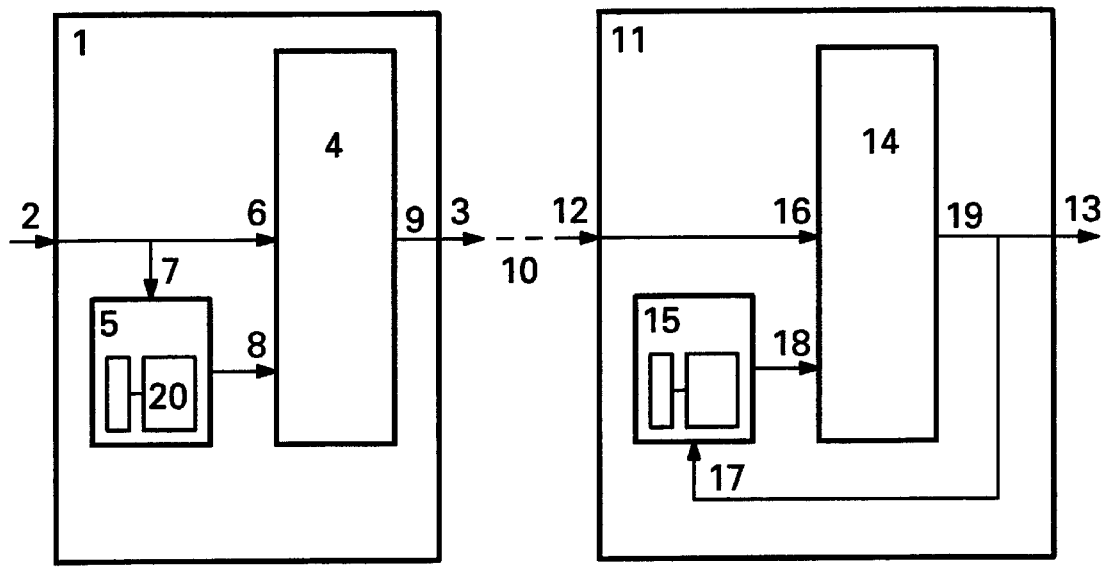
FIG. 1 shows a system according to the invention.
FIG. 2 shows memory means comprising memory fields.

The system according to the invention as shown in FIG. 1 comprises a first coding section 1 for coding a first digital signal into a second digital signal and comprises a second coding section 11 for decoding the second digital signal into a third digital signal. The first coding section 1 and the second coding section 11 are coupled via a transmission channel 10. The first coding section 1 is provided with an input 2 for receiving the first digital signal and with an output 3 for generating the second digital signal and comprises a first coding apparatus 4 and a first arrangement 5. A first input 6 of the first coding apparatus 4 is coupled to the input 2 for receiving the first digital signal comprising a number of symbols. A second input 8 of the first coding apparatus 4 is coupled to an output of the first arrangement 5 for receiving a fourth digital signal comprising at least one probability signal for each symbol to be coded. An output 9 of the first coding apparatus 4 is coupled to the output 3 for generating the second digital signal. An input 7 of the first arrangement 5 is coupled to the input 2 for receiving the first digital signal comprising said number of symbols. The second coding section 11 is provided with an input 12 for receiving the second digital signal and with an output 13 for generating the third digital signal comprising a number of symbols and comprises a second coding apparatus 14 and a second arrangement 15. A first input 16 of the second coding apparatus 14 is coupled to the input 12 for receiving the second digital signal. A second input 18 of the second coding apparatus 14 is coupled to an output of the second arrangement 15 for receiving a fifth digital signal comprising at least one probability signal for each symbol to be decoded. An output 19 of the second coding apparatus 14 is coupled to the output 13 for generating the third digital signal. An input 17 of the second arrangement 15 is coupled to the output 19 for receiving the third digital signal. The first coding section 1 and the second coding section 11 are each provided with memory means comprising memory fields and with processor means coupled to the memory means. Said processor means adapt information stored in said memory means in response to a further received symbol of the first/third digital signal.

The memory means 20 shown in FIG. 2 comprise eight memory fields 21–28. In the first memory field 21 first information $\beta_1$ is stored relating to at least a first probability signal and a second probability signal, and second information $a_1, b_1$ is stored relating to at least a first number of symbols having a first value and a second number of symbols having a second value. In the second memory field 22 third information $\beta_2$ is stored relating to at least a third probability signal and a fourth probability signal, and fourth information $a_2, b_2$ is stored relating to at least a third number of symbols having a first value and a fourth number of symbols having a second value, etc.

Figure 3:
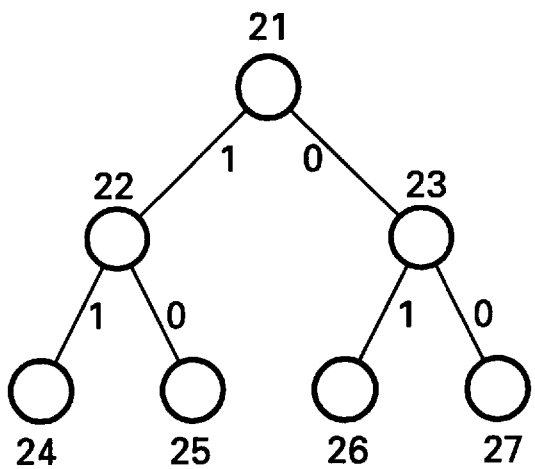
FIG. 3 depicts a flow chart illustrating a context tree weighting algorithm.
Figure 3:
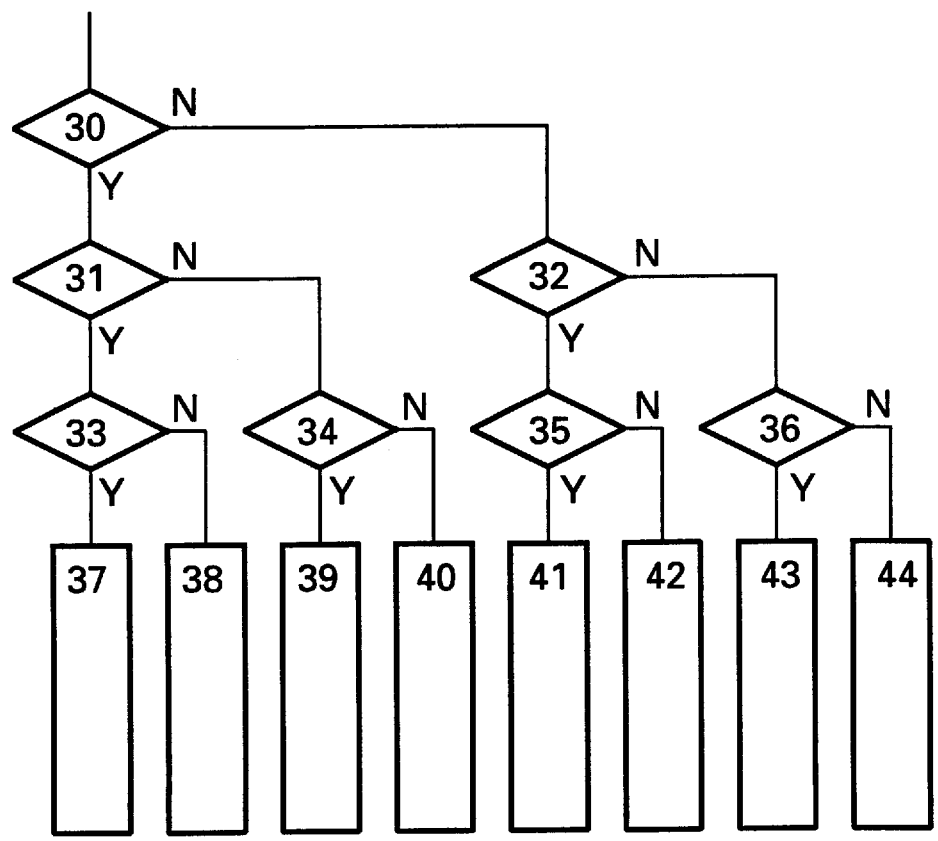

The flow chart depicted in FIG. 3 illustrates a context tree weighting algorithm, which tree is also shown in FIG. 3. This tree comprises seven nodes, a first node 21, a second node 22 coupled to the first node 21 via a link characterised by the symbol "1", a third node 23 coupled to the first node 21 via a link characterised by the symbol "0", a fourth node 24 coupled to the second node 22 via a link characterised by the symbol "1", a fifth node 25 coupled to the second node 22 via a link characterised by the symbol "0", a sixth node 26 coupled to the third node 23 via a link characterised by the symbol "1", and a seventh node 27 coupled to the third node 23 via a link characterised by the symbol "0". The flow chart consists of blocks 30–44 having the following meaning:

block 30
    does the received symbol have the value "1"? if yes, go to block 31, if no, go to block 32 block 31
    (corresponding with node 21) does the previously received symbol have the value "1"? if yes, go to block 33 (node 22), if no, go to block 34 (node 23)

block 32
    (corresponding with node 21) does the previously received symbol have the value "1"? if yes, go to block 35 (node 22), if no, go to block 36 (node 23)

block 33
    (corresponding with node 22) does the further previously received symbol have the value "1"? if yes, go to block 37 (node 24), if no, go to block 38 (node 25)

block 34
    (corresponding with node 23) does the further previously received symbol have the value "1"? if yes, go to block 39 (node 26), if no, go to block 40 (node 27)

block 35
    (corresponding with node 22) does the further previously received symbol have the value "1"? if yes, go to block 41 (node 24), if no, go to block 42 (node 25)

block 36
    (corresponding with node 23) does the further previously received symbol have the value "1"? if yes, go to block 43 (node 26), if no, go to block 44 (node 27)

block 37
$\mu_4 = (a_4+0,5)/(b_4+0,5)$
$b_4 := b_4+1$
$P_w^4(0) = \mu_4/(1+\mu_4)$
$P_w^4(1) = 1/(1+\mu_4)$
$P_e^2(0) = (a_2+0,5)/(a_2+b_2+1)$
$P_e^2(1) = (b_2+0,5)/(a_2+b_2+1)$
$\mu_2 = \{\beta_2 * P_e^2(0) + P_w^4(0)\}/\{\beta_2 * P_e^2(1) + P_w^4(1)\}$
$\beta_2 := \{\beta_2 * P_e^2(1)\}/P_w^4(1)$
$b_2 := b_2+1$
$P_w^2(0) = \mu_2/(1+\mu_2)$
$P_w^2(1) = 1/(1+\mu_2)$
$P_e^1(0) = (a_1+0,5)/(a_1+b_1+1)$
$P_e^1(1) = (b_1+0,5)/(a_1+b_1+1)$
$\mu_1 = \{\beta_1 * P_e^1(0) + P_w^2(0)\}/\{\beta_1 * P_e^1(1) + P_w^2(1)\}$
$\beta_1 := \{\beta_1 * P_e^1(1)\}/P_w^2(1)$
$b_1 := b_1+1$ block 38
$\mu_5 = (a_5+0,5)/(b_5+0,5)$
$b_5 := b_5+1$
$P_w^5(0) = \mu_5/(1+\mu_5)$
$P_w^5(1) = 1/(1+\mu_5)$
$P_e^2(0) = (a_2+0,5)/(a_2+b_2+1)$
$P_e^2(1) = (b_2+0,5)/(a_2+b_2+1)$
$\mu_2 = \{\beta_2 * P_e^2(0) + P_w^5(0)\}/\{\beta_2 * P_e^2(1) + P_w^5(1)\}$
$\beta_2 := \{\beta_2 * P_e^2(1)\}/P_w^5(1)$
$b_2 := b_2+1$
$P_w^2(0) = \mu_2/(1+\mu_2)$
$P_w^2(1) = 1/(1+\mu_2)$
$P_e^1(0) = (a_1+0,5)/(a_1+b_1+1)$
$P_e^1(1) = (b_1+0,5)/(a_1+b_1+1)$
$\mu_1 = \{\beta_1 * P_e^1(0) + P_w^2(0)\}/\{\beta_1 * P_e^1(1) + P_w^2(1)\}$
$\beta_1 := \{\beta_1 * P_e^1(1)\}/P_w^2(1)$
$b_1 := b_1+1$ block 39
$\mu_6 = (a_6+0,5)/(b_6+0,5)$
$b_6 := b_6+1$
$P_w^6(0) = \mu_6/(1+\mu_6)$
$P_w^6(1) = 1/(1+\mu_6)$
$P_e^3(0) = (a_3+0,5)/(a_3+b_3+1)$
$P_e^3(1) = (b_3+0,5)/(a_3+b_3+1)$
$\mu_3 = \{\beta_3 * P_e^3(0) + P_w^6(0)\}/\{\beta_3 * P_e^3(1) + P_w^6(1)\}$
$\beta_3 := \{\beta_3 * P_e^3(1)\}/P_w^6(1)$
$b_3 := b_3+1$
$P_w^3(0) = \mu_3/(1+\mu_3)$
$P_w^3(1) = 1/(1+\mu_3)$
$P_e^1(0) = (a_1 0,5)/(a_1+b_1+1)$
$P_e^1(1) = (b_1+0,5)/(a_1+b_1+1)$
$\mu_1 = \{\beta_1 * P_e^1(0) + P_w^3(0)\}/\{\beta_1 * P_e^1(1) + P_w^3(1)\}$
$\beta_1 := \{\beta_1 * P_e^1(1)\}/P_w^3(1)$
$b_1 := b_1+1$ block 40
$\mu_7 = (a_7+0,5)/(b_7+0,5)$
$b_7 := b_7+1$
$P_w^7(0) = \mu_7/(1+\mu_7)$
$P_w^7(1) = 1/(1+\mu_7)$
$P_e^3(0) = (a_3+0,5)/(a_3+b_3+1)$
$P_e^3(1) = (b_3+0,5)/(a_3+b_3+1)$
$\mu_3 = \{\beta_3 * P_e^3(0) + P_w^7(0)\}/\{\beta_3 * P_e^3(1) + P_w^7(1)\}$
$\beta_3 := \{\beta_3 * P_e^3(1)\}/P_w^7(1)$
$b_3 := b_3+1$
$P_w^3(0) = \mu_3/(1+\mu_3)$
$P_w^3(1) = 1/(1+\mu_3)$
$P_e^1(0) = (a_1+0,5)/(a_1+b_1+1)$
$P_e^1(1) = (b_1+0,5)/(a_1+b_1+1)$
$\mu_1 = \{\beta_1 * P_e^1(0) + P_w^3(0)\}/\{(\beta_1 * P_e^1(1) + P_w^3(1)\}$
$\beta_1 := \{\beta_1 * P_e^1(1)\}/P_w^3(1)$
$b_1 := b_1+1$ block 41
$\mu_4 = (a_4+0,5)/(b_4+0,5)$
$a_4 := a_4+1$
$P_w^4(0) = \mu_4/(1+\mu_4)$
$P_w^4(1) = 1/(1+\mu_4)$
$P_e^2(0) = (a_2+0,5)/(a_2+b_2+1)$
$P_e^2(1) = (b_2+0,5)/(a_2+b_2+1)$
$\mu_2 = \{\beta_2 * P_e^2(0) + P_w^4(0)\}/\{\beta_2 * P_e^2(1) + P_w^4(1)\}$
$\beta_2 := \{\beta_2 * P_e^2(0)\}/P_w^4(0)$
$a_2 := a_2+1$
$P_w^2(0) = \mu_2/(1+\mu_2)$
$P_w^2(1) = 1/(1+\mu_2)$
$P_e^1(0) = (a_1+0,5)/(a_1+b_1+1)$ $P_e^1(1)=(b_1+0,5)/(a_1+b_1+1)$
$\mu_1=\{\beta_1*P_e^1(0)+P_w^2(0)\}/\{\beta_1*P_e^1(1)+P_w^2(1)\}$
$\beta_1:=\{\beta_1*P_e^1(0)\}/P_w^2(0)$
$a_1:=a_1+1$
block 42
$\mu_5=(a_5+0,5)/(b_5+0,5)$
$a_5:=a_5+1$
$P_w^5(0)=\mu_5/(1+\mu_5)$
$P_w^5(1)=1/(1+\mu_5)$
$P_e^2(0)=(a_2+0,5)/(a_2+b_2+1)$
$P_e^2(1)=(b_2+0,5)/(a_2+b_2+1)$
$\mu_2=\{\beta_2*P_e^2(0)+P_w^5(0)\}/\{\beta_2*P_e^2(1)+P_w^5(1)\}$
$\beta_2:=\{\beta_2*P_e^2(0)\}/P_w^5(0)$
$a_2:=a_2+1$
$P_w^2(0)=\mu_2/(1+\mu_2)$
$P_w^2(1)=1/(1+\mu_2)$
$P_e^1(0)=(a_1+0,5)/(a_1+b_1+1)$
$P_e^1(1)=(b_1+0,5)/(a_1+b_1+1)$
$\mu_1=\{\beta_1*P_e^1(0)+P_w^2(0)\}/\{\beta_1*P_e^1(1)+P_w^2(1)\}$
$\beta_1:=\{\beta_1*P_e^1(0)\}/P_w^2(0)$
$a_1:=a_1+1$
block 43
$\mu_6=(a_6+0,5)/(b_6+0,5)$
$a_6:=a_6+1$
$P_w^6(0)=\mu_6/(1+\mu_6)$
$P_w^6(1)=1/(1+\mu_6)$
$P_e^3(0)=(a_3+0,5)/(a_3+b_3+1)$
$P_e^3(1)=(b_3+0,5)/(a_3+b_3+1)$
$\mu_3=\{\beta_3*P_e^3(0)+P_w^6(0)\}/\{\beta_3*P_e^3(1)+P_w^6(1)\}$
$\beta_3:=\{\beta_3*P_e^3(0)\}/P_w^6(0)$
$a_3:=a_3+1$
$P_w^3(0)=\mu_3/(1+\mu_3)$
$P_w^3(1)=1/(1+\mu_3)$
$P_e^1(0)=(a_1+0,5)/(a_1+b_1+1)$
$P_e^1(1)=(b_1+0,5)/(a_1+b_1+1)$
$\mu_1=\{\beta_1*P_e^1(0)+P_w^3(0)\}/\{\beta_1*P_e^1(1)+P_w^3(1)\}$
$\beta_1:=\{\beta_1*P_e^1(0)\}/P_w^3(0)$
$a_1:=a_1+1$
block 44
$\mu_7=(a_7+0,5)/(b_7+0,5)$
$a_7:=a_7+1$
$P_w^7(0)=\mu_7/(1+\mu_7)$
$P_w^7(1)=1/(1+\mu_7)$
$P_e^3(0)=(a_3+0,5)/(a_3+b_3+1)$
$P_e^3(1)=(b_3+0,5)/(a_3+b_3+1)$
$\mu_3=\{\beta_3*P_e^3(0)+P_w^7(0)\}/\{\beta_3*P_e^3(1)+P_w^7(1)\}$
$\beta_3:=\{\beta_3*P_e^3(0)\}/P_w^7(0)$
$a_3:=a_3+1$
$P_w^3(0)=\mu_3/(1+\mu_3)$
$P_w^3(1)=1/(1+\mu_3)$
$P_e^1(0)=(a_1+0,5)/(a_1+b_1+1)$
$P_e^1(1)=(b_1+0,5)/(a_1+b_1+1)$
$\mu_1=\{\beta_1*P_e^1(0)+P_w^3(0)\}/\{\beta_1*P_e^1(1)+P_w^3(1)\}$
$\beta_1:=\{\beta_1*P_e^1(0)\}/P_w^3(0)$
$a_1:=a_1+1$ The operation of the first arrangement 5 comprising the memory means 20 is, in view of the flow chart and the tree depicted in FIG. 3, as follows. Suppose the first digital signal comprises, during a certain time interval, the symbols 0011100100101. In that case, the last received symbol has the value "1", the previously received symbol has the value "0" and the further previously received symbol has the value "1". This corresponds, in the flow chart, to the blocks 30, 31, 34 and 39, and in the tree, to the nodes 21, 23 and 26. As a consequence of this situation, the following calculations are made by the processor means ($P_e^i$ and $P_w^j$ in this case being conditional probabilities):

$\mu_6=(a_6+0,5)/(b_6+0,5)$: the processor means will first read out the values of $a_6$ and $b_6$ from the sixth memory field 26 and will then calculate the value of $\mu_6$ with respect to node 26;

$b_6:=b_6+1$: the processor means subsequently increase the value of $b_6$ by one and store this new value of $b_6$ in the sixth memory field 26 (only the value of $b_6$ is increased because the last received symbol has the value "1", in case the last received symbol would have had the value "0" only the value of $a_6$ would have been increased);

$P_w^6(0)=\mu_6/(1+\mu_6)$: with respect to node 23, the processor means calculate $P_w^6(0)$ at the hand of the calculated value of $\mu_6$;

$P_w^6(1)=1/(1+\mu_6)$: with respect to node 23, the processor means calculate $P_w^6(0)$ at the hand of the calculated value of $\mu_6$;

$P_e^3(0)=(a_3+0,5)/(a_3+b_3+1)$ the processor means will first read out the values of $a_3$ and $b_3$ from the third memory field 23 and will then calculate the value of $P_e^3(0)$ with respect to node 23;

$P_e^3(1)=(b_3+0,5)/(a_3+b_3+1)$: the processor means will first read out the values of $a_3$ and $b_3$ from the third memory field 23 and will then calculate the value of $P_e^3(1)$ with respect to node 23;

$\mu_3=\{\beta_3*P_e^3(0)+P_w^6(0)\}/\{\beta_3*P_e^3(1)+P_w^6(1)\}$: the processor means will first read out the value of $\beta_3$ from the third memory field 23 and will then calculate the value of $\mu_3$ at the hand of the stored value of $\beta_3$ and the calculated values of $P_e^3(0)$, $P_w^6(0)$, $P_e^3(0)$, and $P_w^6(1)$;

$\beta_3:=\{\beta_3*P_e^3(1)\}/P_w^6(1)$: the processor means update the value of $\beta_3$ at the hand of the old, stored value of $\beta_3$ and the calculated values of $P_e^3(1)$; and $P_w^6(1)$ and store the new value of $\beta_3$ (a second combination signal) in the third memory field 23 (in case the last received symbol would have had the value "0" the values of $P_e^3(0)$ and $P_w^6(0)$ would have been used);

$b_3:=b_3+1$: the processor means subsequently increase the value of $b_3$ by one and store this new value of $b_3$ in the third memory field 23 (only the value of $b_3$ is increased because the last received symbol has the value "1", in case the last received symbol would have had the value "0" only the value of $a_3$ would have been increased);

$P_w^3(0)=\mu_3/(1+\mu_3)$: with respect to node 21, the processor means calculate the value of $P_w^3(0)$ at the hand of the calculated value of $\mu_3$;

$P_w^3(1)=1/(1+\mu_3)$: with respect to node 21, the processor means calculate the value of $P_w^3(1)$ at the hand of the calculated value of $\mu_3$;

$P_e^1(0)=(a_1+0,5)/(a_1+b_1+1)$: the processor means will first read out the values of $a_1$ and $b_1$ from the first memory field 21 and will then calculate the value of $P_e^1(0)$ with respect to node 21;

$P_e^1(1)=(b_1+0,5)/(a_1+b_1+1)$: the processor means will first read out the values of $a_1$ and $b_1$ from the first memory field 21 and will then calculate the value of $P_e^1(1)$ with respect to node 21;

$\mu_1=\{\beta_1*P_e^1(0)+P_w^3(0)\}/\{\beta_1*P_e^1(1)+P_w^3(1)\}$: the processor means will first read out the value of $\beta_1$ from the first memory field 21 and will then calculate the value of $\mu_1$ (a third combination signal) at the hand of the stored value of $\beta_1$ and the calculated values of $P_e^1(0)$, $P_w^3(0)$, $P_e^1(1)$: and $P_w^3(1)$;

$\beta_1:=\{\beta_1*P_e^1(1)\}/P_w^3(1)$ the processor means update the value of $\beta_1$ at the hand of the old, stored value of $\beta_1$ and the calculated values of $P_e^1(1)$ and $P_w^3(1)$; and store the new value of $\beta_1$ (a first combination signal) in the first memory field 21 (in case the last received symbol would have had the value "0" the values of $P_e^1(0)$ and $P_w^3(0)$ would have been used);

$b_1:=b_1+1$: the processor means subsequently increase the value of $b_1$ by one and store this new value of $b_1$ in the first memory field 21 (only the value of $b_1$ is increased because the last received symbol has the value "1", in case the last received symbol would have had the value "0" only the value of $a_1$ would have been increased);

So, in dependence of the last received symbol and previously received symbols (the context, in this case defined by two previously received symbols, the depth of the tree being equal to the value "2") $\beta$'s and $\mu$'s are calculated. Due to using $\beta$ and $\mu$, each $\beta$ being a combination signal which is stored instead of several probability signals, and each $\mu$ being a combination signal which especially in a more complex situation is used for communication between nodes, the needed memory capacity is reduced. As stated before, a further reduction can be realised by establishing logarithmic representations of probability signals and of each $\beta$ and $\mu$ and using these logarithmic representations for the calculations, and by lopping off probability signals and $\beta$ and $\mu$ and/or lopping off said logarithmic representations.

According to a first embodiment, the first arrangement 5 generates at its output $\mu_1$ (the third combination signal in this case being equal to the fourth digital signal), which is supplied to the second input 8 of the first coding apparatus 4 as the fourth digital signal. In that case, the first coding apparatus 4 could comprise said conversion means for converting $\mu_1$ into said probability.

According to a second embodiment, the first coding apparatus 4 being a known encoder, a probability signal (for example comprising $P_w^1(1)$ and $P_w^1(0)$) should be supplied to the second input 8 as the fourth digital signal. The known encoder 4 then codes the first digital signal comprising a number of symbols and arriving at the first input 6 at the hand of this probability signal, whereby $P_w^1(1)$ and $P_w^1(0)$ are calculated for each received symbol by using the formulaes $P_w^1(0)=\mu_1/(1+\mu_1)$ and $P_w^1(1)=1/(1+\mu_1)$. In that case, the first arrangement 5 should comprise conversion means for converting $\mu_1$ (the third combination signal) into this probability and for generating this probability (the fourth digital signal) at the output of the first arrangement 5.

The operation of the second arrangement 15 is in correspondence with the operation of the first arrangement 5, apart from the following. Due to the fact that the input 17 of the second arrangement 15 is coupled to the output 19 of the second coding apparatus 14 (compare the input 7 of first arrangement 5 being coupled to the first input 6 of the first coding apparatus 4), the operation of the second arrangement 15 will not perform the function disclosed by block 30 depicted in FIG. 3. Therefore the second arrangement 15 cannot distinguish between blocks 37 and 41, between 38 and 42, between 39 and 43 and between 40 and 44. As a consequence of this, with respect to the functions disclosed by the blocks 37–44, it will not immediately be possible to increase a's and/or b's and/or to adapt $\beta$'s, but this can be done at a later time, after decoding has taken place.

The invention should not be limited to the coding and decoding of signals comprising symbols having a first or a second value (socalled binary symbols). To a person skilled in the art it will be obvious that the invention can also be used for the coding and decoding of signals comprising symbols having one out of three or more values. For example, in case of symbols having a first, a second or a third value, for each node there will be three conditional weighted probabilities, three conditional estimated probabilities and two $\mu$'s and one $\beta$.

The flow chart depicted in FIG. 3 illustrates a context tree weighting algorithm, which tree is also shown in FIG. 3 having a depth being equal to the value "2". Usually, trees will for example have a depth being equal to a value "20". Then the number of nodes will be $2^{21-1}$, and the flow chart will comprise $2^{21}$ final blocks, instead of eight blocks 37–44. In that case it will be clear that another type of flow chart should be used, which another type of flow chart should for example comprise a socalled "loop". Then a number of memory fields could be allocated dynamically.

As stated above, in this case the context is defined by two previously received symbols. Of course, it will be also possible to use another signal as the context, for example symbols which have been received before said two previously received symbols, like in case of videocoding, for example the signal belonging to another videoline or another videochannel. Further it is possible that the context comprises nonbinary symbols. In that case, as will be clear to a person skilled in the art, either in the tree there will be more than two nodes (for example eight nodes) coupled to a higher node, or in the tree there will be socalled "fake-nodes".

It is assumed that the second digital signal generated at the output of the first coding apparatus 4 is equal to the second digital signal arrived at the first input of the second coding apparatus 14. In other words, the transmission channel should be errorfree, which can be guaranteed by using techniques known to a person skilled in the art. Then, in case the first coding section 1 and the second coding section 11 are matched, the first digital signal will be equal to the third digital signal.

Instead of storing, per node, the values of "a" and "b", it will also be possible to store, for example "a–b" and "a+b" (whereby it should even not be excluded that the value of "a+b" will be a fixed, predefined value during some time). Therefore, in general, second (fourth) information will be stored relating to at least a first (third) number of symbols having a first value and a second (fourth) number of symbols having a second value. Further, at the beginning, "a", "b" and $\beta$ should be initiated, a possible initialisation being a=0, b=0 and $\beta$=1.

We claim:

1. System comprising a first coding section for coding a first digital signal into a second digital signal and comprising a second coding section for decoding the second digital signal into a third digital signal, the first coding section and the second coding section being coupled via a transmission channel, the first coding section comprising a first arrangement being provided with
   an input for receiving the first digital signal comprising a number of symbols,
   an output for generating a fourth digital signal comprising at least one probability signal,
a first coding apparatus being provided with
   a first input for receiving the first digital signal comprising said number of symbols,
   a second input for receiving the fourth digital signal originating from the first arrangement, and an output for generating the second digital signal, and the second coding section comprising a second arrangement being provided with
an input for receiving the third digital signal comprising a number of symbols and originating from a second coding apparatus,
an output for generating a fifth digital signal comprising at least one probability signal,
the second coding apparatus being provided with
a first input for receiving the second digital signal originating from the first coding apparatus,
a second input for receiving the fifth digital signal originating from the second arrangement, and
an output for generating the third digital signal comprising said number of symbols,
the first coding section and the second coding section each being provided with
memory means comprising at least a first memory field and a second memory field for storing in the first memory field at least
first information relating to at least two probability signals, and
second information relating to at least a first number of symbols having a first value and a second number of symbols having a second value,
and for storing in the second memory field at least
third information relating to at least two probability signals, and
fourth information relating to at least a third number of symbols having a first value and a fourth number of symbols having a second value, and
processor means coupled to the memory means for adapting the information in response to a further received symbol, characterised in that the first coding section and the second coding section are each provided with
combining means for combining at least two probability signals into a first combination signal, the first information being a function of this first combination signal, and for combining at least two probability signals into a second combination signal, the third information being a function of this second combination signal, and for combining at least two probability signals into a third combination signal, and
converting means for converting the third combination signal into at least one probability signal.

2. System according to claim 1, characterised in that the first combination signal comprises a ratio of probability signals, and that the second combination signal comprises a ratio of probability signals.

3. Coding section for coding a first digital signal into a second digital signal, the first coding section comprising
a first arrangement being provided with
an input for receiving the first digital signal comprising a number of symbols,
an output for generating a fourth digital signal comprising at least one probability signal,
a first coding apparatus being provided with
a first input for receiving the first digital signal comprising said number of symbols,
a second input for receiving the fourth digital signal originating from the first arrangement, and
an output for generating the second digital signal, the coding section being provided with
memory means comprising at least a first memory field and a second memory field for storing in the first memory field at least
first information relating to at least two probability signals, and
second information relating to at least a first number of symbols having a first value and a second number of symbols having a second value, and for storing in the second memory field at least
third information relating to at least two probability signals, and
fourth information relating to at least a third number of symbols having a first value and a fourth number of symbols having a second value, and
processor means coupled to the memory means for adapting the information in response to a further received symbol, characterised in that the coding section is provided with
combining means for combining at least two probability signals into a first combination signal, the first information being a function of this first combination signal, and for combining at least two probability signals into a second combination signal, the third information being a function of this second combination signal, and for combining at least two probability signals into a third combination signal, and
converting means for converting the third combination signal into at least one probability signal.

4. Coding section according to claim 3, characterised in that the first combination signal comprises a ratio of probability signals, and that the second combination signal comprises a ratio of probability signals.

5. Arrangement comprising
an input for receiving a first digital signal comprising a number of symbols,
an output for generating a fourth digital signal comprising at least one probability signal,
memory means comprising at least a first memory field and a second memory field for storing in the first memory field at least
first information relating to at least two probability signals, and
second information relating to at least a first number of symbols having a first value and a second number of symbols having a second value,
and for storing in the second memory field at least
third information relating to at least two probability signals, and
fourth information relating to at least a third number of symbols having a first value and a fourth number of symbols having a second value, and
processor means coupled to the memory means for adapting the information in response to a further received symbol, characterised in that the arrangement is provided with
combining means for combining at least two probability signals into a first combination signal, the first information being a function of this first combination signal, and for combining at least two probability signals into a second combination signal, the third information being a function of this second combination signal.

6. Arrangement according to claim 5, characterised in that the first combination signal comprises a ratio of probability signals, and that the second combination signal comprises a ratio of probability signals.

7. Method for coding a first digital signal into a second digital signal and for decoding the second digital signal into a third digital signal, the method comprising the steps of
receiving the first digital signal comprising a number of symbols, generating, in response to the first digital signal, a fourth digital signal comprising at least one probability signal, coding the first digital signal into the second digital signal by using the fourth digital signal, generating, in response to the third digital signal, a fifth digital signal comprising at least one probability signal, decoding the second digital signal into the third digital signal by using the fifth digital signal, storing in a first memory field at least first information relating to at least two probability signals, and second information relating to at least a first number of symbols having a first value and a second number of symbols having a second value, storing in a second memory field at least third information relating to at least two probability signals, and fourth information relating to at least a third number of symbols having a first value and a fourth number of symbols having a second value, and adapting the information in response to a further received symbol, characterised in that the method comprises the steps of combining at least two probability signals into a first combination signal, the first information being a function of this first combination signal, combining at least two probability signals into a second combination signal, the third information being a function of this second combination signal, combining at least two probability signals into a third combination signal, and converting the third combination signal into at least one probability signal.

8. Method according to claim 7, characterised in that the first combination signal comprises a ratio of probability signals, and that the second combination signal comprises a ratio of probability signals.

* * * * *